(12) United States Patent
Fosco et al.

(10) Patent No.: US 6,212,656 B1
(45) Date of Patent: Apr. 3, 2001

(54) AUTOMATED SCAN CHAIN SIZING USING SYNOPSYS

(75) Inventors: Brian Thomas Fosco, Morgan Hill; Bruce Pember, Redwood City, both of CA (US)

(73) Assignee: Adaptec, Inc., Milpitas, CA (US)

( * ) Notice: Subject to any disclaimer, the term of this patent is extended or adjusted under 35 U.S.C. 154(b) by 0 days.

(21) Appl. No.: 09/208,594

(22) Filed: Dec. 8, 1998

(51) Int. Cl.[7] .................................................. G01R 31/28
(52) U.S. Cl. ............................ 714/726; 714/730; 712/220
(58) Field of Search .................................... 714/726, 729, 714/724, 741, 30, 31, 32, 33; 712/220, 227

(56) References Cited

U.S. PATENT DOCUMENTS

| | | | |
|---|---|---|---|
| 5,185,745 | * | 2/1993 | Manca, Jr. ............................ 714/726 |
| 5,485,467 | * | 1/1996 | Golnabi ............................... 714/733 |
| 5,627,841 | * | 5/1997 | Nakamura ........................... 714/731 |
| 6,105,156 | * | 8/2000 | Yamauchi ........................... 714/738 |

* cited by examiner

Primary Examiner—Christine T. Tu
(74) Attorney, Agent, or Firm—Martine Penilla & Kim, LLP

(57) ABSTRACT

A method of configuring scan mode circuitry of an integrated circuit (IC) device includes parsing through an initial file of the scan-flops that are to be included in the scan mode circuitry. The initial file can be prepared with a synthesis tool such as Synopsys. A particular subset of scan-flops are parsed, according to an identified number to be included in each scan chain. A holding tank is created to hold each subset of scan-flops for each scan chain. Each holding tank is then used to form a scan path and to stitch the corresponding scan chain. The parsing of the scan-flops into holding tanks can be performed with a c-shell script. Also, the c-shell script can be called by a Synopsys dc_shell script.

27 Claims, 6 Drawing Sheets

US 6,212,656 B1

AUTOMATED SCAN CHAIN SIZING USING SYNOPSYS

BACKGROUND OF THE INVENTION

1. Field of the Invention

This invention relates generally to computer systems and associated hardware, and particularly to methods and apparatuses for facilitating testing of integrated circuit devices.

2. Description of the Related Art

Electronic devices, such as computer chips, can include multiple and often thousands of logic circuits. To ensure that the logic circuits are operating correctly before they are put to use, these circuits are tested to verify wiring integrity. To facilitate this testing, during fabrication flip-flops are configured with multiplexers to form scan-flops. As is shown in FIG. 1, a scan-flop 10 includes a flip-flop 12 electrically connected to a multiplexer (MUX) 14. A data-in signal (DI) and a scan-in signal (SI) are input to the MUX 14 along with a scan-enable signal (SE). An output is passed from the MUX 14 to the flip-flop 12 through an electrical connection 16, to provide a data signal D to the flip-flop 12. A clock signal CLK is also passed to the flip-flop 12. Thus, with the clock signal CLK and data signal D, the flip-flop 12 generates an output signal Q and an output signal NQ which is the inverse of Q.

Scan-flops such as that shown in FIG. 1 are then electrically connected to each other in series to form a scan chain, in a process sometimes referred to as scan chain stitching. Other non-scan logic circuitry (miscellaneous logic) that is to be tested by the scan mode testing, is also electrically connected to the scan chain, interspersed between various scan-flops. For example, FIG. 2 depicts a representative scan chain 20. A scan-flop 10 is connected to miscellaneous logic 24, which is desired to be tested with the scan chain 20. Another scan-flop 10' is connected to miscellaneous logic 24 to complete the scan chain. Of course, other miscellaneous logic and other scan-flops can be included in the scan chain 20. In particular, other miscellaneous logic 26 is connected to scan-flop 10, as well as to other miscellaneous logic or scan-flop of another scan-chain (not shown).

Signals, in the form of a test vector, can be passed through the scan chain 20 to test the miscellaneous logic by monitoring the output signal. Typically the test vector is introduced to the scan chain as the scan-in signal SI of the first scan-flop 10 of the scan chain 20. Scan signals 22, including a scan-in signal SI, scan-enable signal SE, and clock signal CLK, are shown introduced to the scan flops 10 and 10' of the scan chain 20. The test vector is sequentially shifted into each scan-flop of the scan chain, in accordance with the clock signal CLK. After the test vector is passed into the miscellaneous logic from adjacent scan-flops, the scan-flops are sequentially unloaded to an output signal SO. This output signal SO is then analyzed to verify the wiring and functionality of the miscellaneous logic that is electrically connected to the scan chain. For example, the output signal can be compared to an output signal that would be expected, given the known scan chain path, miscellaneous logic, and test vector, with any differences being indicative of a possible fault in the miscellaneous logic circuitry. In addition, the inverse output signals NQ and NQ' of the scan-flops 10 and 10' can be passed to other circuitry such as miscellaneous logic 26 or scan-flops of other scan chains (not shown).

As is well known, in order to load the test vector into the scan chain 20 to initiate testing, the test vector data must be sequentially loaded into each scan flop 20. Unfortunately, the longer the scan chain is, the longer the time to test the device. This is because loading each individual scan-flop with the test vector requires one clock. Accordingly, this sequential loading and unloading of all of the scan-flops each entail a number of clocks equal to the number of scan-flops, which can be in the order of thousands. The greater this test time is, the lower the production yield, and therefore the lower the production output. Therefore, in order to minimize the impact of testing on production output, test time can be limited by limiting the size of the scan chains during the design phase. Thus, rather than having a single scan chain of several thousand scan-flops, multiple scan chains that can be run in parallel may be used, each with a certain desired maximum number of scan-flops.

While two scan-flops 10 and 10' are depicted in the scan chain 20 of FIG. 2, a typical scan chain can encompass thousands of scan-flops 10. Typically, the particular scan path of a scan chain 20 can be designed using a synthesis tool, such as Synopsys which can be obtained from Synopsys, Inc. of Mountain View, Calif. Information regarding operational and other aspects of Synopsys can be found in "About Synopsys Online Documentation—Version 1998.02," which is incorporated herein by reference. Such a tool is utilized to identify which scan-flops are to be included within a particular scan chain, to determine the particular scan path that is to be formed between both scan-flops 10 and the miscellaneous logic that is to be tested, and to physically stitch the scan chain. Unfortunately, such tools require a user to manually input each register that is to be included on a single scan chain. This manual designation includes manually counting each scan-flop and identifying it as being within the scan chain. As the number of scan-flops increases, the error rate in designated these scan-flops can become increasingly burdensome and prone to error. This problem is further exacerbated by increasing circuit densities on IC devices.

Thus, it is desired to have a method and system for creating multiple scan chains having varying numbers of scan-flops, within a single design, while minimizing error rates and design time.

SUMMARY OF THE INVENTION

Broadly speaking, the present invention fills these needs by providing a method and apparatus for an automated technique of creating multiple scan chains, each of any desired length, within the same test circuitry design. In particular, a Unix c-shell script is called to parse through a list of all of the scan-flops that are to be used in the test circuitry. The list of all of the scan-flops to be used can be formed with a synthesis tool, such as Synopsys. It should be appreciated that the present invention can be implemented in numerous ways, including as a process, an apparatus, a system, a device, a method, or a computer readable medium. Several inventive embodiments of the present invention are described below.

A method for designing scan mode circuitry for testing electrical interconnections within an integrated circuit design includes identifying each one of a plurality of scan-flops that will be part of the scan mode circuitry, and declaring each one of the plurality of scan-flops as being part of a valid scan path and writing the plurality of scan-flops to a file. The method also includes executing a Unix c-shell script for creating a plurality of scan sub-chains from the plurality of scan-flops, such that the creating includes defining a plurality of holding tanks for storing each of the scan sub-chains. Also, a scan path is declared for each of the scan sub-chains that are stored in each of the plurality of holding tanks, as is a set of test signals for each of the scan sub-chains. In addition, the method includes stitching each of the scan sub-chains of the plurality of scan-flops that are part of the executable file.

A method for configuring scan mode circuitry of an integrated circuit device includes preparing an initial file listing a plurality of scan-flops that will be used in the scan mode circuitry. Also, a holding tank is created for each of a plurality of scan chains, each holding tank listing a subset of the plurality of scan-flops that form a particular scan chain. In addition, both a scan path and a test vector are determined for each scan chain. The method further includes identifying a pin for each component of each test vector, as well as stitching each scan chain.

A computer readable medium containing program instructions for configuring test circuitry of an integrated circuit (IC) device to facilitate scan mode testing of the IC device includes program instructions for creating an initial file listing a plurality of scan-flops that are to be integrated on the IC device. The computer readable medium further includes program instructions for parsing through the initial file for a first particular number of scan-flops, thereby defining a first subset of the plurality of scan-flops. In addition, the computer readable medium includes program instructions for listing the first subset of the plurality of scan-flops to a first subset file, as well as program instructions for using the first subset file to form a first scan chain, that includes the first subset of the plurality of scan-flops, on the device.

Although the embodiments of the present invention have multiple additional advantages, the ability of the present invention to automatically configure scan chains having varying numbers of scan-flops, provides for faster and more accurate scan mode circuitry design and formation. These and other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings wherein like reference numerals designate like elements.

DETAILED DESCRIPTION OF THE PREFERRED EMBODIMENTS

An invention is described for a method for testing the functionality and wiring of an integrated circuit device. In the following description, numerous specific details are set forth in order to provide a thorough understanding of the present invention. It will be obvious, however, to one skilled in the art, that the present invention may be practiced without some or all of these specific details. In other instances, well known process operations have not been described in detail in order not to unnecessarily obscure the present invention.

Figure 1:
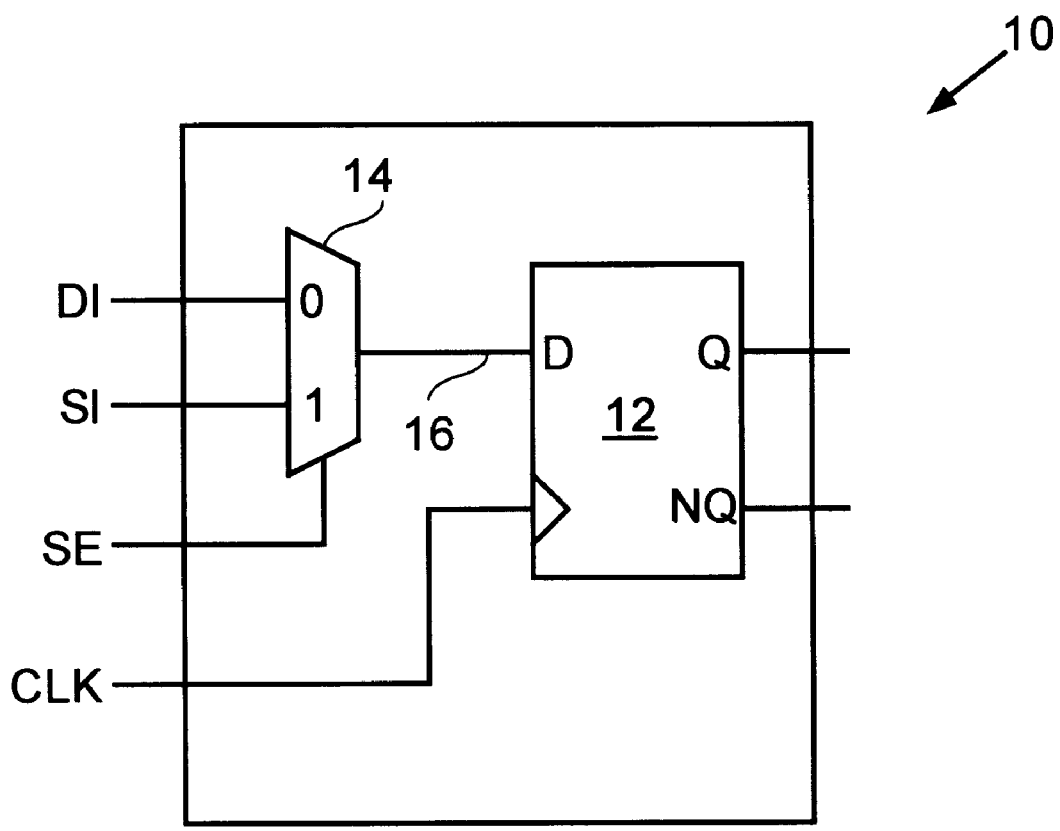
FIG. 1 is a schematic of a prior art flip-flop circuit.
Figure 2:
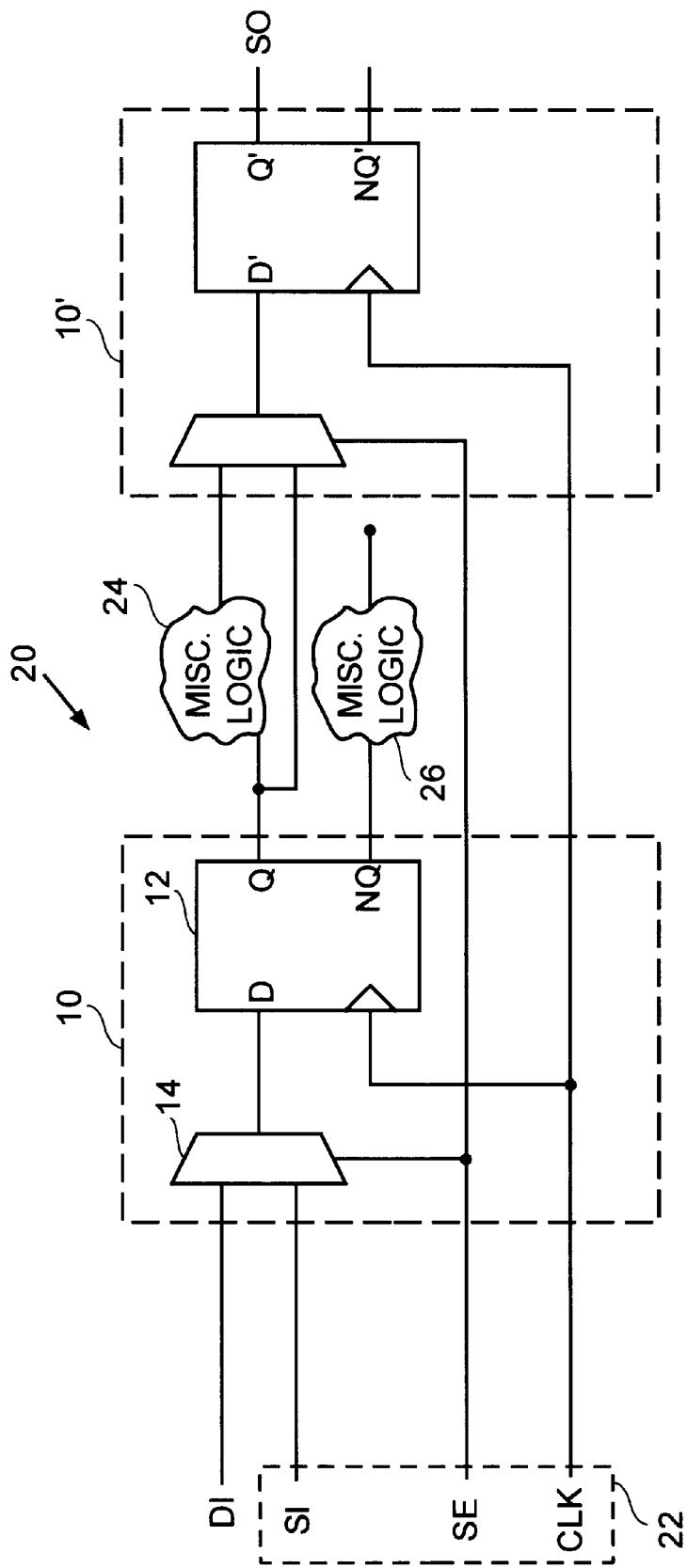
FIG. 2 is a schematic of a portion of test circuitry, including two scan-flops of a scan chain of the prior art.
Figure 3:
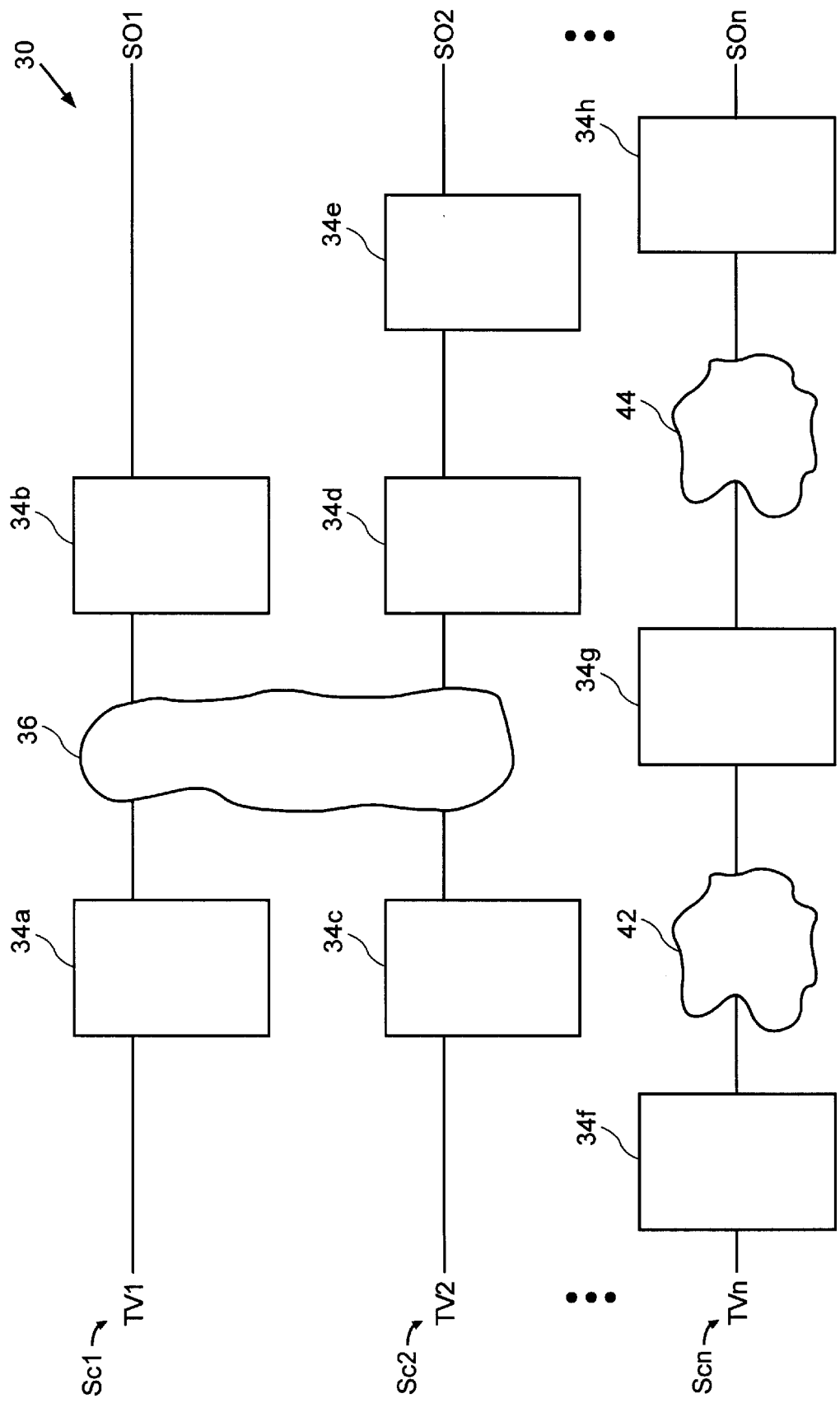
FIG. 3 depicts a plurality of scan chains for testing an integrated circuit device, in accordance with an embodiment of the present invention.

FIG. 3 depicts, in schematic form, a network of scan chains forming scan mode circuitry 30 for testing electrical interconnections within an integrated circuit design. The scan mode circuitry 30 includes "n" scan chains SC1 through SCn. A first scan chain SC1 begins with a scan-flop 34a that will initially receive the test vector data. The scan-flop 34a is further connected to a miscellaneous logic 36. The miscellaneous logic 36 then couples to a scan-flop 34b which is configured to generate a first scan-out signal SO1.

A second scan chain SC2 includes scan-flops 34c, 34d, and 34e. In addition, the second scan chain SC2 is also connected to miscellaneous logic 36 between scan-flops 34c and 34d. Thus, an output signal passed from scan-flop 34a to miscellaneous logic 36 can effect a second scan-output signal SO2, while an output signal from scan-flop 34c that is passed to miscellaneous logic 36 can affect the first scan-output signal SO1. Any number of similar scan chains can be included in the scan mode circuitry 30, up to "n" scan chains and including the nth scan chain SCn having the scan-flops 34f, 34g, and 34h coupled in series with miscellaneous logic 42 and miscellaneous logic 44. The nth scan chain SCN outputs an nth scan-output signal SOn. Each of the scan chains of the scan mode circuitry 30 can include any number of scan-flops 34 and any portions of miscellaneous logic, including miscellaneous logic which is connected to multiple scan chains, such as miscellaneous logic 36 as shown in FIG. 3.

The scan chains are operated by a test vector TV which is introduced at the beginning of a scan chain, and then activates the miscellaneous logic and scan-flops of the particular scan chain to produce a scan output signal SO at the end of the particular chain. For example, a first test vector TV1 is introduced to the first scan chain SC1. Through operation of the test vector TV1, the scan-flop 34a passes an output signal to miscellaneous logic 36. In this way, the first test vector TV1 activates the miscellaneous logic 36. Likewise, other test vectors, through an nth test vector TVn, are introduced to the other scan chains of scan mode circuitry 30, thereby producing additional scan output signals SO2 through SOn. The scan output signals SO1 to SOn can then be analyzed to identify errors in the operation, and therefore wiring, of the tested miscellaneous logic.

Figure 4:
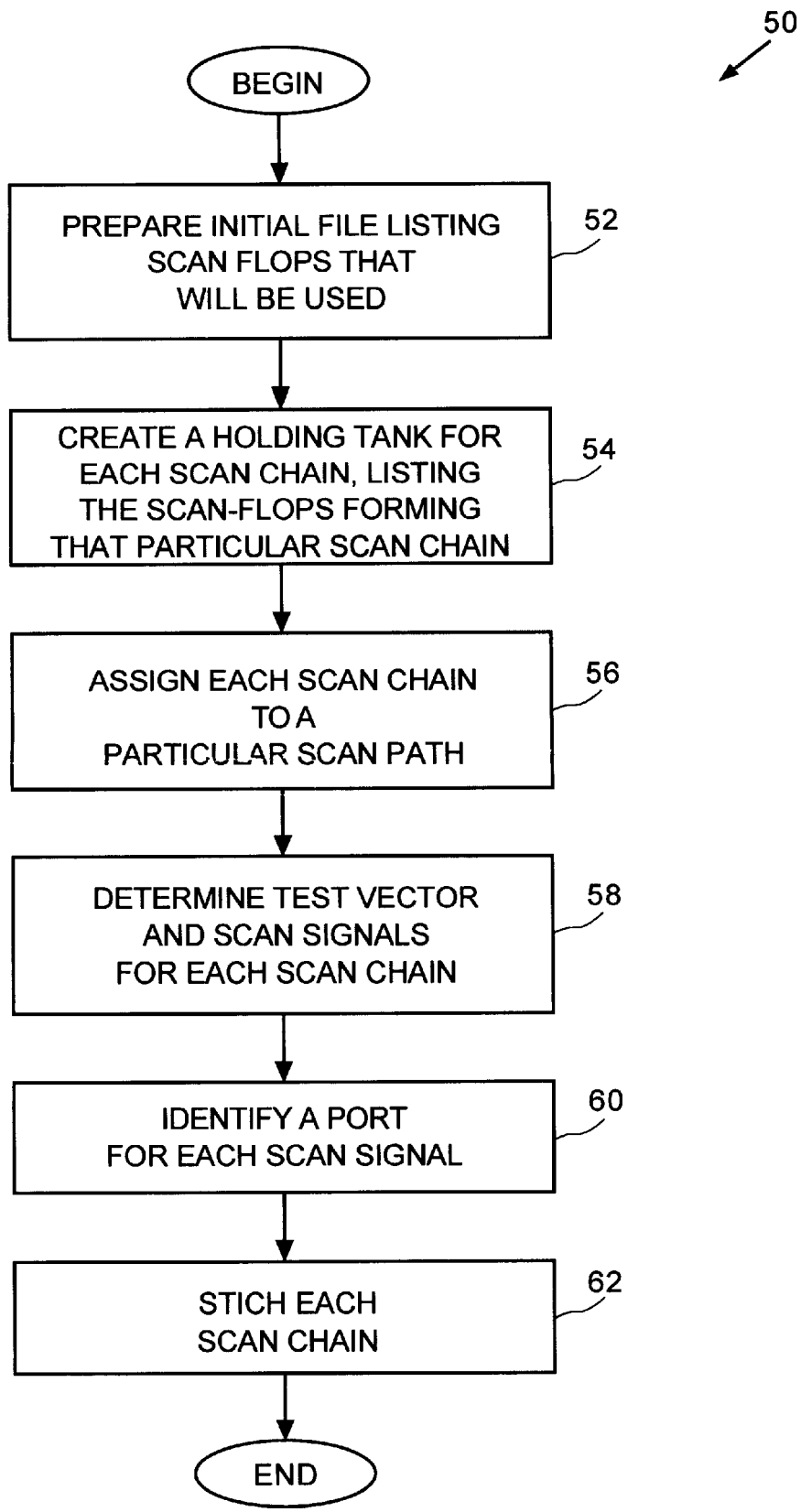
FIG. 4 is a flow chart of a method for forming a plurality of scan chains in test circuitry, according to an embodiment of the present invention.

FIG. 4 is a flow chart of a method 50 for designing scan mode circuitry on an integrated circuit device. In operation 52, an initial file is prepared which lists the scan-flops that will be used in the scan mode circuitry. This can be accomplished using a Synopsys command which upon activation, automatically identifies all of the clock-based flip flops in the design. Alternatively, this can be accomplished with a synthesis tool such as Synopsys, with which a user can identify all of the scan-flops in the initial file. A holding tank is then created in operation 54 for each desired scan chain, listing the particular scan-flops that form the particular scan chain. This operation is further detailed with reference to FIG. 5. Further, in operation 56 each scan chain of each holding tank created in operation 54 is assigned to a particular scan path.

In operation 58, a test vector and scan signals are generated for each of the scan chains. Various methods can be used to generate the test vectors, such as utilization of generation software, for example Sunrise that can be obtained from Synopsys, Inc. of Mountain View, Calif. Each test vector includes data which will be passed to, and thereby exercise, the miscellaneous logic of the scan chain to which it is passed. As such, the shorter the scan chain is, the shorter the corresponding testing time. During scan mode testing, each test vector is simultaneously passed to a corresponding scan chain. Therefore, with shorter test vectors scan mode testing can be accomplished in less time than if longer test vectors were passed through longer scan chains.

Operation 58 also entails the generation of various scan signals for each scan chain. These scan signals generated in operation 58 include the scan enable signal SE and the scan in signal SI which act as inputs to the scan-flops of the scan chain. In operation 60, ports are identified for each of the scan signals to facilitate introduction of the scan signals to each scan chain. More particularly, a port is identified for each flip-flop port of each scan-flop. Each scan chain is stitched in operation 62 in accordance with its scan path determined in operation 56. This stitching involves the designation of physical electrical connections between the scan-flops of the scan chain, according to the scan path.

Figure 5:
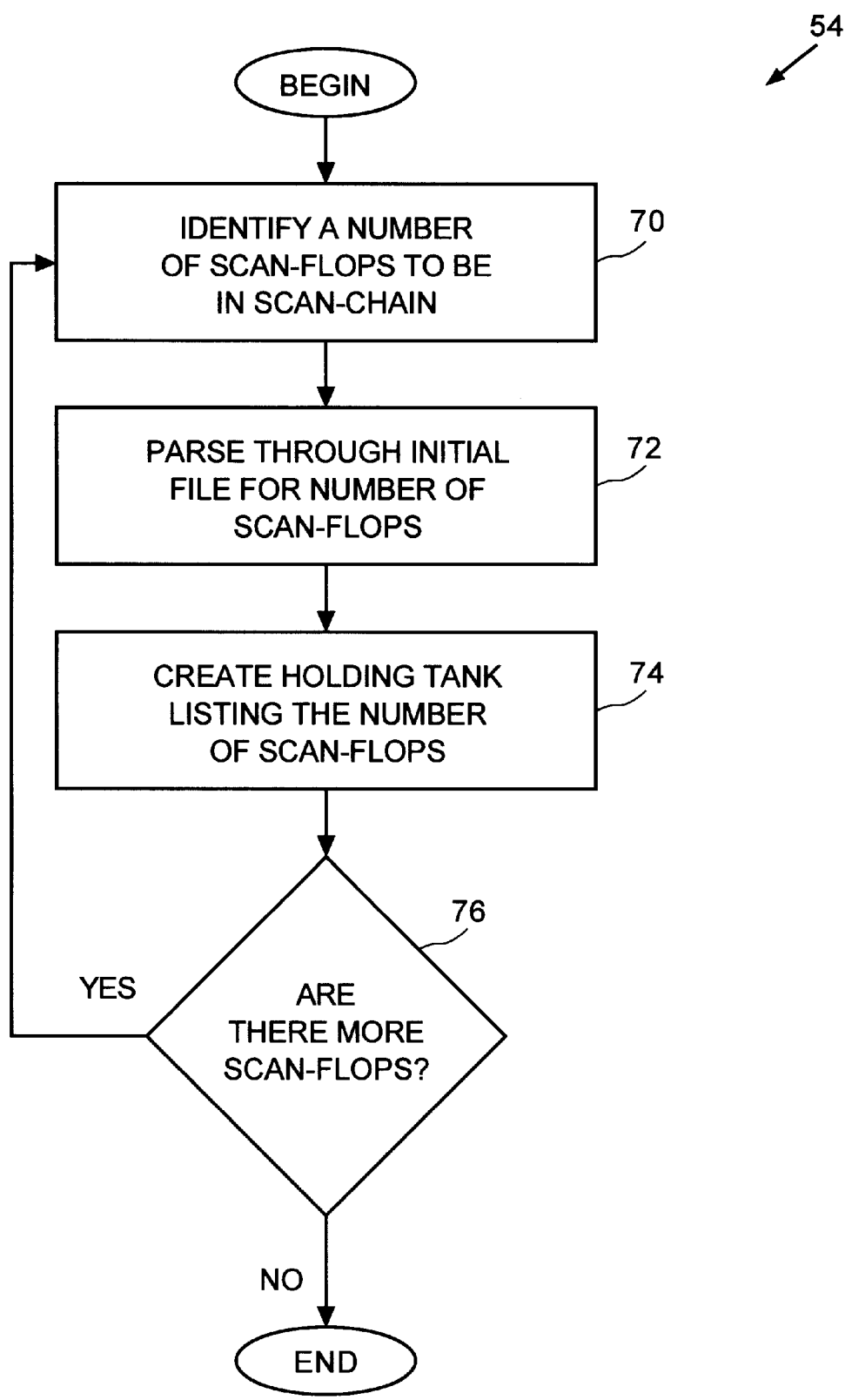
FIG. 5 is a flow chart of the operations included in one of the operations of FIG. 4, according to an embodiment of the present invention.

FIG. 5 is a flow chart of the operations included in operation 54 of FIG. 4. In operation 70, the particular number of scan-flops that are to be included in a scan chain are identified. For example, in a case where 1500 scan-flops have been listed in the initial file in operation 52, then number 800 can be identified in operation 70. The initial file is parsed through for the particular number of scan-flops, in operation 72. Thus, if the number 800 was identified in operation 70, 800 scan-flops of the initial file of 1500 scan-flops would be parsed through. Operation 74 includes the creation of a holding tank that lists the scan-flops that were parsed through in operation 72. In the hypothetical previously posited, this holding tank would include the 800 scan-flops that were parsed through. In operation 76, it is determined whether there are more scan-flops in the initial file. If there are more scan-flops in the initial file, the operation 54 returns to operation 70 where a particular number of scan-flops to be included in the next scan chain is identified. It is also possible that this number of scan-flops for the next chain can be a default number. For example, this number can be set to equal that of the first holding tank, or can default to the number of remaining scan-flops in the initial file that have not been parsed through.

More particularly, the default number can be the number of remaining scan-flops if such is less than the first holding tank number. Thus, in the case of the 1500 initial scan-flops and 800 scan-flop first holding tank, the number identified for the next holding tank can be 700. The process then iterates through operations 70 through 76 until all of the scan-flops in the initial file have been parsed. Alternatively, upon the determination of more scan-flops in operation 76, the process can continue with operation 72, without a new identification of a different number of scan-flops to be included in the next scan chain. In such a case, the operation 54 would proceed with iteration of operations 72 through 76 until all of the scan-flops in the initial file had been parsed.

In method 50 of FIG. 4, the initial file preparation of operation 52, scan path identification in operation 56, scan signal generation in operation 58, port identification in operation 60, and stitching of operation 62 can be automated using a synthesis tool, such as a hardware description language (HDL) engine. An example of such a synthesis tool, is Synopsys. The Synopsys synthesis tool can be run in a Unix environment, while a c-shell script is run in operation 54. The Synopsys commands can either be individually entered on a Unix command line by the user, or can be incorporated within a Unix script that is run in the Unix environment. In addition, the c-shell script used to implement operation 54 can be called from the Unix environment either by user input line command or by a command within the Synopsys script. An example of such a Synopsys script is depicted in Table 1, along with annotations of the various components of this script. In addition, an example of a c-shell script that can be used in conjunction with the Synopsys script to implement operation 54 of FIG. 4, is shown in Table 2 along with explanatory annotations.

TABLE 1

| | |
|---|---|
| set_scan_configuration -style multiplexed_flip_flop<br>set_scan_configuration -clock_mixing mix_clocks<br>set_scan_configuration -methodology full_scan<br>set_scan_configuration -hierarchical_isolation true<br>set_scan_configuration -add_lockup false<br>set_scan_configuration -chain count 4 | Set configuration variables for Synopsys SCAN insertion |
| gated_cells - find (cell, "sd*1*bit" hicr) +\<br>        find (cell, "reqackiasel_reg" hier) +\<br>        find (cell, "sdblase_reg" -hier) +\<br>        find (cell, "ringcnt_reg*" -hier) +\<br>        find (cell, "ackidet*" -hier) +\<br>        find (cell, "reqacki_toggle*" -hier | Create list of individual cells to be included on its own scan chain. |
| hifclk_cells = all_registers(-clock HIFCLK) - find (cell, U1) - find (cell, U2) | Create temporary list of all HIFCLK based flip flops in the design. |
| set_scan_path -dedicated_scan_out true hifclka chain hifclk cells > hifclk.regs | Assign flip flop list to a scan path and dump data out into file "hifclk.regs". |
| sh csh parse_hifclk | Execute "parse_hifclk" command in CShell UNIX environment (see Table 2). |
| include hifclka_chain.wscr | Execute Synopsys script generated by the CShell UNIX script. Make list of first 800 flip flops that will be on a SCAN chain. |
| hifclkb_cells = hifclk_cells hifclka_cells | Make list of remaining flip flops by subtracting the first 800 from the flip flop list. |
| set_scan_path -dedicated_scan_out true hifclka_cells > hifclka_cells | Assign hifclka_cells list that was generated to actual scan path. |
| set_scan_path -dedicated_scan_out true hifclkb_cells > hifclkb_cells | Assign hifclkb_cells list that was generated to actual scan path. |

TABLE 1-continued

| | |
|---|---|
| set_scan_path -dedicated_scan_out true<br>gated_chain gated cells > gated_cells.list<br>set_scan_signal "test_scan_enable" -port<br>"scanenable"<br>set_scan_signal "test_scan_in" -port<br>"hifclka_scanin" -chain hifclka_chain<br>set_scan_signal "test_scan_out" -port<br>"hifclka_scanout" -chain hifclka_chain<br>set_scan_signal "test_scan_in" -port<br>"hifclkb_scanin" -chain hifclkb_chain<br>set_scan_signal "test_scan_out" -port<br>"hifclkb_scanout" -chain hifclkb_chain<br>set_scan_signal "test_scan_in" -port<br>"bclk_scanin" -chain bclk_chain<br>set_scan_signal "test_scan_out" -port<br>"bclk_scanout" -chain bclk_chain<br>set_scan_signal "test_scan_in" -port<br>"gated_scanin" -chain gated_chain<br>set_scan_signal "test_scan_out" -port<br>"gated_scanout" -chain gated_chain | Generate various scan signals and assign them to ports in the design. |
| insert_scan -ignore_compile_design_rules ><br>scan.insert_scan | Stitch the scan chain specified in this script. |
| write -f db -hier -o "s_hif.scan.db" | Save the design file to the disk. |
| exit | End. |

TABLE 2

| | |
|---|---|
| rm temp<br>rm hifclka_chain.wscr | Remove files prior to creating them, so as to avoid "file exists" error when try to create them. |
| echo "hifclka_cells = {\" ><br>hifclka_chain.wscr | Generate first line in the "holding tank" file which is a Synopsys script with a list of the registers to be on the SCAN chain. |
| cut -d" "" -f2 hifclk.regs\|<br>sed 's/hifclka_chain//g' > temp | Parse the file "hifclk.regs" for the actual flip flop names. |
| sed -n '1,798p' temp\|<br>awk '{printf("%s, \\\n", $0)}' >><br>hifclka_chain.wscr<br>sed -n '799,799p' temp\|<br>awk '{printf("%s}", $0)}' >><br>hifclka_chain.wscr | Limit the first chain to 800 flops. |

The present invention may employ various computer-implemented operations involving data stored in computer systems to drive computer software, including application programs, operating system programs, peripheral device drivers, etc. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

Any of the operations described herein that form part of the invention are useful machine operations. The invention also relates to a device or an apparatus for performing these operations. The apparatus may be specially constructed for the required purposes, or it may be a general purpose computer selectively activated or configured by a computer program stored in the computer. In particular, various general purpose machines may be used with computer programs written in accordance with the teachings herein, or it may be more convenient to construct a more specialized apparatus to perform the required operations. An exemplary structure for the invention is described below.

Figure 6:
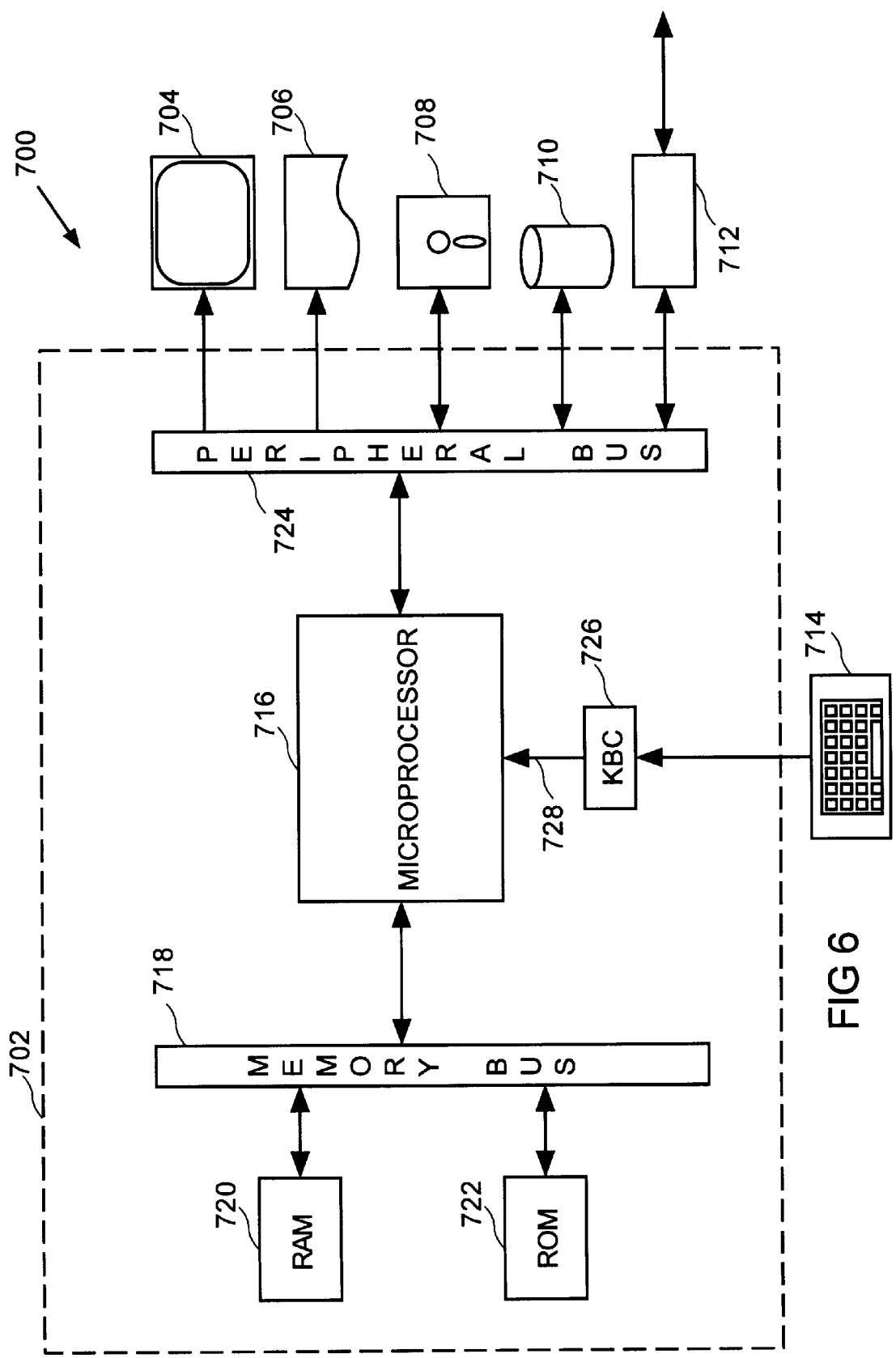
FIG. 6 depicts a computer system for performing program instructions according to various embodiments of the present invention.

FIG. 6 is a block diagram of an exemplary computer system 700 for carrying out the processing according to the invention. The computer system 700 includes a digital computer 702, a display screen (or monitor) 704, a printer 706, a floppy disk drive 708, a hard disk drive 710, a network interface 712, and a keyboard 714. The digital computer 702 includes a microprocessor 716, a memory bus 718, random access memory (RAM) 720, read only memory (ROM) 722, a peripheral bus 724, and a keyboard controller (KBC) 726. The digital computer 702 can be a personal computer (such as an IBM compatible personal computer, a Macintosh computer or Macintosh compatible computer), a workstation computer (such as a Sun Microsystems or Hewlett-Packard workstation), or some other type of computer.

The microprocessor 716 is a general purpose digital processor which controls the operation of the computer system 700. The microprocessor 716 can be a single-chip processor or can be implemented with multiple components. Using instructions retrieved from memory, the microprocessor 716 controls the reception and manipulation of input data and the output and display of data on output devices. According to the invention, a particular function of microprocessor 716 is to assist in execution and rendering of the software operations of a synthesis tool and/or a script for parsing through an initial file listing all of the scan-flops to be included in the scan-mode testing circuitry.

The memory bus 718 is used by the microprocessor 716 to access the RAM 720 and the ROM 722. The RAM 720 is used by the microprocessor 716 as a general storage area and as scratch-pad memory, and can also be used to store input data and processed data. The ROM 722 can be used to store instructions or program code followed by the microprocessor 716 as well as other data.

The peripheral bus 724 is used to access the input, output, and storage devices used by the digital computer 702. In the described embodiment, these devices include the display screen 704, the printer device 706, the floppy disk drive 708, the hard disk drive 710, and the network interface 712. The keyboard controller 726 is used to receive input from keyboard 714 and send decoded symbols for each pressed key to microprocessor 716 over bus 728.

The display screen 704 is an output device that displays images of data provided by the microprocessor 716 via the peripheral bus 724 or provided by other components in the computer system 700. The printer device 706, when operating as a printer, provides an image on a sheet of paper or a similar surface. Other output devices such as a plotter, typesetter, etc. can be used in place of, or in addition to, the printer device 706.

The floppy disk drive 708 and the hard disk drive 710 can be used to store various types of data. The floppy disk drive 708 facilitates transporting such data to other computer systems, and hard disk drive 710 permits fast access to large amounts of stored data.

The microprocessor 716 together with an operating system operate to execute computer code and produce and use data. The computer code and data may reside on the RAM 720, the ROM 722, or the hard disk drive 710. The computer code and data could also reside on a removable program medium and loaded or installed onto the computer system 700 when needed. Removable program media include, for example, CD-ROM, PC-CARD, floppy disk and magnetic tape.

The network interface 712 is used to send and receive data over a network connected to other computer systems. An interface card or similar device and appropriate software implemented by the microprocessor 716 can be used to connect the computer system 700 to an existing network and transfer data according to standard protocols.

The keyboard 714 is used by a user to input commands and other instructions to the computer system 700. Other types of user input devices can also be used in conjunction with the present invention. For example, pointing devices such as a computer mouse, a track ball, a stylus, or a tablet can be used to manipulate a pointer on a screen of a general-purpose computer.

The invention can also be embodied as computer readable code on a computer readable medium. The computer readable medium is any data storage device that can store data which can be thereafter be read by a computer system. Examples of the computer readable medium include read-only memory (ROM), random-access memory (RAM), CD-ROMs, magnetic tape, and optical data storage devices. The computer readable medium can also be distributed over a network that couples computer systems so that the computer readable code is stored and executed in a distributed fashion.

Furthermore, the same or similar methods and apparatuses described above for programming a hardware device can also be used for performing other particular maintenance operations on the hardware device. For example, operations such as erasing a ROM, reading a ROM, or performing a checksum on a ROM can be performed.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method for designing scan mode circuitry for testing electrical interconnections within an integrated circuit design, the method comprising:

identifying each one of a plurality of scan-flops that will be part of the scan mode circuitry;

declaring each one of the plurality of scan-flops as being part of a valid scan path and writing the plurality of scan-flops to an executable file;

executing a Unix c-shell script for creating a plurality of scan sub-chains from the plurality of scan-flops, such that the creating includes defining a plurality of holding tanks for storing each of the scan sub-chains;

declaring a scan path for each of the scan sub-chains that are stored in each of the plurality of holding tanks;

declaring a set of test signals for each of the scan sub-chains; and stitching each of the scan sub-chains of the plurality of scan-flops that are part of the executable file.

2. The method for designing scan mode circuitry as recited in claim 1, wherein the holding tanks are executable files.

3. A method for designing scan mode circuitry as recited in claim 1, wherein each of the sub-scan chains is configured to be integrated into the same integrated circuit design.

4. A method for designing scan mode circuitry as recited in claim 1, wherein the declared set of test signals include a scan input (SI) signal, a scan enable (SE) signal, and a clock (CLK) signal.

5. A method for designing scan mode circuitry as recited in claim 1, wherein the method implements a synthesis tool that initiates the calling of the unix c-shell script after the synthesis tool performs the declaring of each one of the plurality of scan-flops that are to be part of the valid scan path.

6. A method for designing scan mode circuitry as recited in claim 5, wherein the synthesis tool is a Synopsys tool.

7. A method for configuring test circuitry on an integrated circuit (IC) device that includes a plurality of scan-flops, to facilitate scan mode testing of the IC device with efficiently maximized fault coverage, comprising:

identifying a first particular number of scan-flops that is desired to be in a first scan chain;

parsing through the plurality of scan-flops for the first particular number of scan-flops, using a computer-implemented script, thereby parsing through a first subset of the plurality of scan-flops to be included in the first scan chain; and listing the first subset of the plurality of scan-flops in a first holding tank to be used to form the first scan chain.

8. The method as recited in claim 7, further comprising:

identifying a second particular number of scan-flops that is desired to be in a second scan chain;

parsing through the plurality of scan-flops for the second particular number of scan-flops, using a computer-implemented script, thereby parsing through a second subset of the plurality of scan-flops to be included in a second scan chain; and listing the second subset of the plurality of scan-flops in a second holding tank to be used to form the second scan chain.

9. The method as recited in claim 8, further comprising:

forming the first scan chain including the first subset of the plurality of scan-flops; and forming the second scan chain including the second subset of the plurality of scan-flops.

10. The method as recited in claim 9, further comprising:

identifying a set of scan-flops from the plurality of scan-flops that are included on the IC device, the set of scan-flops including scan-flops that are desired to be included in the test circuitry, whereby the parsing through the plurality of scan-flops is performed through the set of scan-flops.

11. The method as recited in claim 9, wherein forming the first scan chain includes:

determining a first scan path for the first scan chain;

defining electrical connections for the first subset of the plurality of scan-flops according to the first scan path;

determining a first test vector for the first scan chain, the first test vector including a value for a signal that can be applied to the first scan chain to facilitate the production of a first test output signal that can be analyzed to determine a functionality of the device;

defining first scan signals to be introduced to the first scan chain, to facilitate the operation of the scan-flops in the first scan chain; and assigning each of the first scan signals to a port in the device, for facilitating the introduction of the first scan signals to the first scan chain; and wherein forming the second scan chain includes:

determining a second scan path for the second scan chain;

defining electrical connections for the second subset of the plurality of scan-flops according to the second scan path;

determining a second test vector for the second scan chain, the second test vector including a value for a second signal that can be applied to the second scan chain to facilitate the production of a second test output signal that can be analyzed to determine a wire interconnection functionality of the device;

defining second scan signals to be introduced to the second scan chain, to facilitate the operation of the scan-flops in the second scan chain; and assigning each of the second scan signals to a port in the device, for facilitating the introduction of the second scan signals to the second scan chain.

12. The method as recited in claim 7, further comprising:

forming the first scan chain including the first subset of the plurality of scan-flops.

13. The method as recited in claim 12, wherein forming the first scan chain comprises:

determining a first scan path for the first scan chain; and defining electrical connections for the first subset of the plurality of scan-flops according to the first scan path.

14. The method as recited in claim 13, wherein forming the first scan chain further comprises:

determining a first test vector for the first scan chain, the first test vector including a first signal that can be applied to the first scan chain to facilitate the production of a first test output signal that can be analyzed to determine a wire-interconnection functionality of the device;

defining scan signals to be introduced to said first scan chain to facilitate operation of said scan-flops; and assigning each of the scan signals to a port in the device, for facilitating the introduction of the scan signals to the first scan chain.

15. The method as recited in claim 14, wherein the scan signals include a scan-in signal and a scan-enable signal.

16. A method for configuring scan mode circuitry of an integrated circuit device, the method comprising:

preparing an initial file listing a plurality of scan-flops that will be used in the scan mode circuitry;

creating a holding tank for each of a plurality of scan chains, each holding tank listing a subset of the plurality of scan-flops forming a particular scan chain;

determining a scan path for each scan chain;

determining a test vector for each scan chain;

determining scan signals for each scan chain, including a scan-in signal and a scan-enable signal;

assigning each scan signal to a port of the integrated circuit device, for facilitating introduction of a scan signal to a scan-flop of each scan; and stitching each scan chain.

17. The method as recited in claim 16, wherein creating a holding tank includes:

identifying a number of scan-flops to be in one of the plurality of scan chains;

parsing through the initial file for the number of scan-flops; and creating a holding tank listing the number of scan-flops the form the one of the plurality of scan chains.

18. The method as recited in claim 17, wherein the parsing and the creating a holding tank is repeated until all of the initial file has been parsed.

19. The method as recited in claim 17, further comprising:

identifying a second number of scan-flops to be in one of the plurality of scan chains;

parsing through the initial file for the second number of scan-flops; and creating a holding tank listing the second number of scan-flops.

20. The method as recited in claim 16, wherein the holding tank can be executed by a synthesis tool for determining a scan path for the one of the plurality of scan chains.

21. A computer readable medium containing program instructions for configuring test circuitry of an integrated circuit (IC) device to facilitate scan mode testing of the IC device, the computer readable media comprising:

program instructions for parsing through an initial file that lists a plurality of scan-flops that are to be included in the test circuitry, for a first particular number of scan-flops, thereby defining a first subset of the plurality of scan-flops; and program instructions for listing the first subset of the plurality of scan-flops to a first subset file that can be used to form a first scan chain.

22. The computer readable media as recited in claim 21, further comprising:

program instructions for creating the initial file listing the plurality of scan-flops; and program instructions for using the first subset file to designing the electrical connections of a first scan chain that includes the first subset of the plurality of scan-flops.

23. The computer readable media as recited in claim 22, wherein the program instructions for forming a first scan chain on the device includes:

program instructions for determining a first scan path of the first subset of the plurality of scan-flops;

program instructions for determining a first test vector for the first scan chain;

program instructions for determining scan signals for the first scan chain; and program instructions for determining electrical connections for the first scan chain.

24. The computer readable media as recited in claim 21, further comprising program instructions for identifying the first particular number of scan-flops that are desired to be included in the first scan chain.

25. The computer readable media as recited in claim 24, wherein the first subset file further includes program instructions that are recognizable and executable by a hardware description language (HDL) engine to form the first scan chain.

26. The computer readable media as recited in claim 25, wherein the HDL engine is Synopsys.

27. The computer readable media as recited in claim 24, further comprising:

program instructions for creating a second subset file that includes a list of a second subset of the plurality of scan-flops; and program instructions for creating a second scan chain that includes the second subset, using the second subset file.

* * * * *